United States Patent [19]

Luckan et al.

[11] 4,118,624

[45] Oct. 3, 1978

[54] FRAME FOR THE SUPPORT OF ARTICLES WHICH ARE TO BE TREATED

[75] Inventors: Johannes Luckan; Jan Elwart, both of Cologne; Martin Herter, Geyen, all of Germany

[73] Assignee: Ionit Anstalt Bernhad Berghaus, Vaduz, Liechtenstein

[21] Appl. No.: 790,834

[22] Filed: Apr. 25, 1977

[30] Foreign Application Priority Data

May 5, 1976 [DE] Fed. Rep. of Germany ....... 2619814

[51] Int. Cl.² .......................................... H01T 19/04
[52] U.S. Cl. .................................. 250/326; 250/324; 250/492 R
[58] Field of Search .................. 250/492 R, 451, 454, 250/456, 324, 325, 326, 492 B; 339/8 R, 135; 361/225

[56] References Cited

U.S. PATENT DOCUMENTS

| | | | |
|---|---|---|---|
| 3,417,239 | 12/1968 | Blanche-Fraser et al. | 250/492 R |
| 3,506,835 | 4/1970 | Hartmann | 250/454 |
| 3,530,294 | 9/1970 | Rogers | 250/454 |
| 3,865,451 | 2/1975 | Rordorf | 339/8 R |
| 4,029,967 | 6/1977 | Tetzlaff | 250/454 |

Primary Examiner—Alfred E. Smith
Assistant Examiner—B. C. Anderson
Attorney, Agent, or Firm—Bacon & Thomas

[57] ABSTRACT

An article support frame, removably supported in a glow discharge treatment receptacle, is provided with a plurality of upwardly open spherical seats, each having a laterally open entrance slot. Suspension devices which can be attached to the articles to be treated have necks in the entrance slots, spherical plugs removably seated on the spherical seats and transport plugs extending above the spherical plugs.

13 Claims, 6 Drawing Figures

FRAME FOR THE SUPPORT OF ARTICLES WHICH ARE TO BE TREATED

BACKGROUND OF THE INVENTION

This invention concerns a frame for the support of articles which are to be treated by high voltage glow discharge in a receptacle, capable of being connected with a conductor which is carried in the receptacle with insulation.

In the treatment of articles by means of high voltage glow discharges for the purpose of nitride hardening, metallizing, annealing, hardening, carburizing, decarburizing, or the like, of the articles, they are set or hung in a receptacle and are in a circuit as cathode in the case of the use of direct current, and partially as cathode in the case of the use of alternating or polyphase alternating current, while the receptacle correspondingly has the other polarity. However, in this case, the charging is often time-consuming and difficult, particularly when the articles are elongated, such as crankshafts, especially those having partial centers of gravity, which cannot be connected by a straight line, because these elongated articles tend to distort with the heating which is effected during the glow discharge, if they are not hung in such a manner, that bending stresses are excluded. However, the later is difficult to accomplish and prevents an automatic charging of the receptacle.

The treatment of workpieces by means of glow discharge in itself has been well known for a long period of time. In this context see U.S. Pat. Nos. 3,846,574, 3,914,575, and particularly U.S. Pat. No. 3,865,451. The latter patent concerns a suspension device for the suspension of a workpiece and its function is thus similar to the object of the present application. The introduction to the description states that if direct current is used, the workpieces are cathodes in the circuit and the receptacle the anode, while in the case of alternating current, they are cathodes part of the time only. Obviously, the workpieces are heated by ion bombardment and treated in this manner. The cathodic glow light surround the entire surface of the workpiece and naturally also its suspension. Voltages and currents must be chosen at least high enough so that the cathodic glow light covers the entire surface of the workpieces; this, however, depends on the dimensions of the receptacle, the weight of the workpieces and the pressure prevailing in the receptacle. Accordingly, currents and voltages, for example, between a few volts and 1000 volts, between a few amperes and a 1000 amperes, or more, may be selected, depending on requirements.

SUMMARY OF THE INVENTION

It is, therefore, an objective of this invention to provide a frame which makes possible an automatic charging of the receptacle with workpieces and which conducts the electrical energy to the articles, whereby the articles can be arranged in the receptacle without bending stress.

The subject of this invention is, therefore, a frame for the support of articles, which is characterized by a suspension device with receptacle devices, each of which includes a ball socket with insertion opening, and into which the article carriers can be hung, the latter possessing a spherical plug and a transport plug.

The spherical cardan support, which is formed by the ball socket and the spherical plug, thus provided, guarantees a bending stress-free suspension, even of very elongated articles, and makes possible an automatic charging of the frame, in that the article carrier, which is connected with one or several articles, is gripped at its transport plug and is hung, outside of the receptacle, with its spherical plug in the ball socket of the receptacle device, through its insertion opening, and then the frame carrying the articles is inserted in the receptacle. It does not matter if the frame has been distorted by the influence of heat during or after the treatment of the articles by the high voltage glow discharge, because the spherical plugs slide into the ball sockets associated with them even if the measurement of the distance between the charging device for the frame and the position of the ball sockets should have changed. If the frame itself is configured as a current conductor, a good electrically conducting connection between the frame and the articles is always assured by means of the large contact surface of the spherical cardan hanging support. In this case, a ring which is electrically insulated with respect to the receptacle, or an electrically insulated bracket for supporting the frame can be arranged on the side wall of the receptacle. The ring or the brackets can then be supported on insulators, which are movable with respect to the side wall of the receptacle, for example, supported by rollers, in order to compensate for the heat expansion of the hanging device, which is supported on the ring or on the brackets. In this case, the ring or the brackets are connected with the conductor which is located in the receptacle.

It can also be appropriate to electrically insulate the article carriers with respect to the receptacle devices, whereby the article carriers can be electrically connected with a conductor located in the receptacle. For the latter purpose, drop arms, electrically insulated with respect to it, can be fastened to the inside of the side wall of the receptacle, which can be brought into electrically conducting arrangement with the transport plugs of the article carriers and which are connected with the conductor which is located, insulated, in the receptacle. In this case, the drop arms can be arranged on insulators, which are movable with respect to the side wall of the receptacle, for example, supported by rollers.

The electrical insulation of the article carriers with respect to the receptacle devices and their electrical connection with the conductor which is located, insulated, in the receptacle, results in a considerable energy savings, because the hanging support device with the receptacle devices can then be at the same potential with the receptacle, so that a glow seam does not develop on its surfaces and, furthermore, insulation for the ring or the brackets for the support of the frame in the receptacle can be omitted.

The receptacle devices for the article carriers can be arranged superimposed in several levels in order to obtain an optimum space utilization in the container. It may be appropriate to configure the article carrier in star-shape configuration, whereby, at the ends of the stars, fastening devices for the articles are provided. In order to obtain a uniform heat dissipation of the articles in the case of cooled receptacles, so that a uniform treatment temperature is reached, the article carriers are preferably configured in a three-arm form, whereby, on the axis of the receptacle, a cooled electrode is arranged at the same potential as the receptacle.

The ball sockets of the receptacle devices are preferably replaceable, in order to make it possible to easily replace devices which had become damaged due to the glow discharge or by the stress resulting from the weight of the articles.

The hanging support device preferably consists of a ring, on which the receptacle devices are fastened, and from which carrier arms extend outward, being supported on the brackets or the ring on the inner sidewall of the receptacle. In order to obtain a uniform distribution of the electrical field and thus a uniform glow seam at a good load assumption with low weight, the ring is configured semicircular with outwardly directed curvature, especially in section. In addition, the weight of the frame is thus small, with a considerable load capability. In order to assure a good electrical contact between the ring or the brackets and the hanging support device in the case in which the hanging support device has an electrically conducting connection with the articles and the electrical supply line is carried through the electrically insulated ring or the brackets to the bearing of the frame, the carrying arms can be carried elastically insofar that a good electrical contact with a large contact surface between the carrying arms and the ring or the brackets is obtained, even with the heating which is caused by the electrical glow discharge, in addition to the desired load acceptance capability of the frame.

These frames are also suitable, at the completion of the glow discharge treatment, and together with the articles, to be very quickly placed into a hardening bath, whereby, additionally, an easy draining of the hardening agent is assured after the removal from the hardening bath, so that the frame can again be used for a renewed charging, without deleteriously influencing the heating period during the beginning of the glow discharge treatment.

In the following, the invention is described in greater detail in connection with the embodiments which are illustrated in the attached drawings.

DESCRIPTION OF THE PREFERRED EMBODIMENTS

Figure 1:
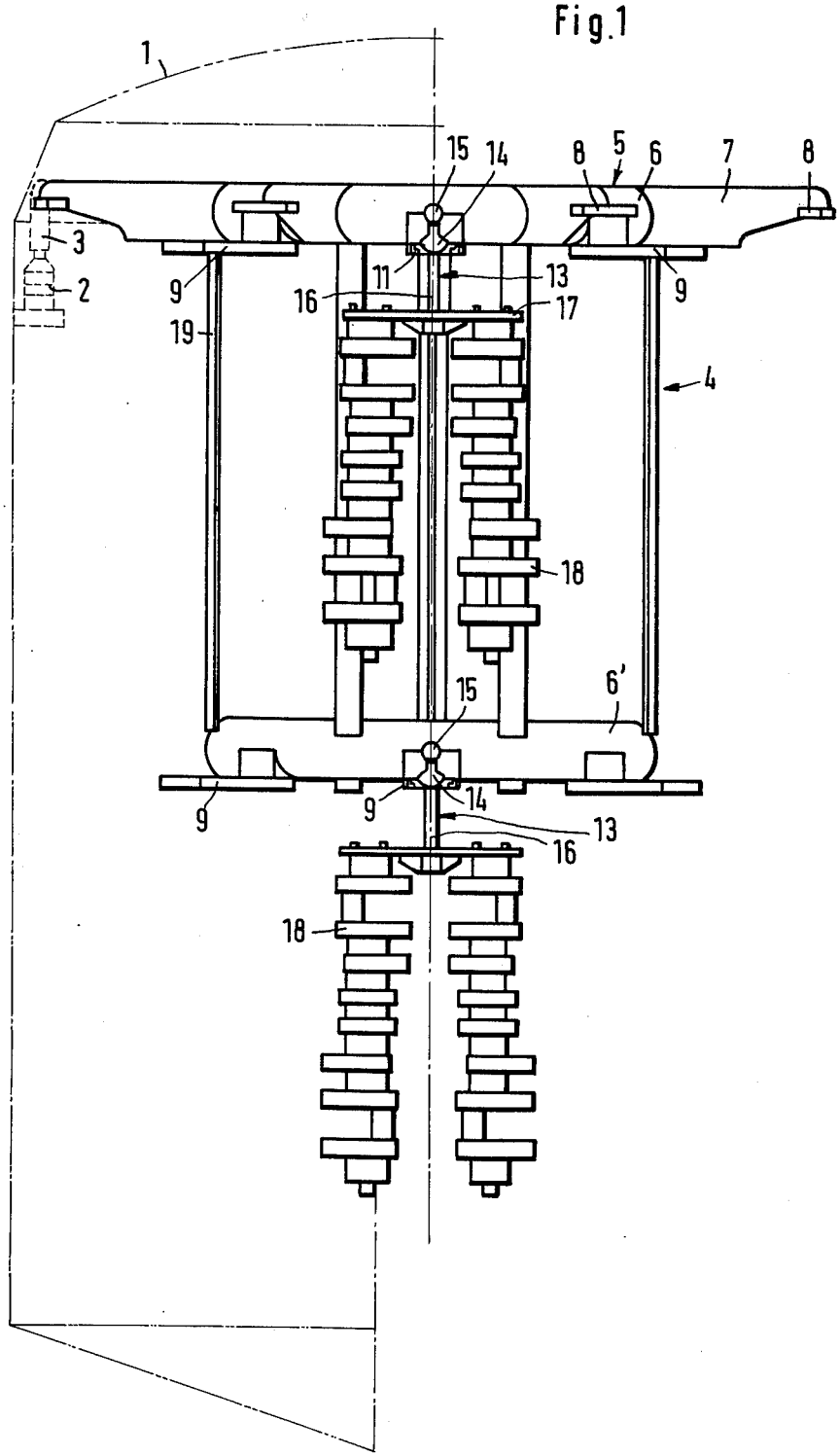
FIG. 1 is a side view of a frame in accordance with this invention, in a schematically illustrated receptacle.

In a receptacle 1, whic is schematically illustrated in FIG. 1, insulators 2 are arranged below the upper edge of its inner side, being equipped with a current ring 3, which has an electrically conducting connection with a conductor, which is not illustrated, which leads through the wall of the receptacle. The current ring 3 is thus electrically insulated with respect to the receptacle 1.

Figure 3:
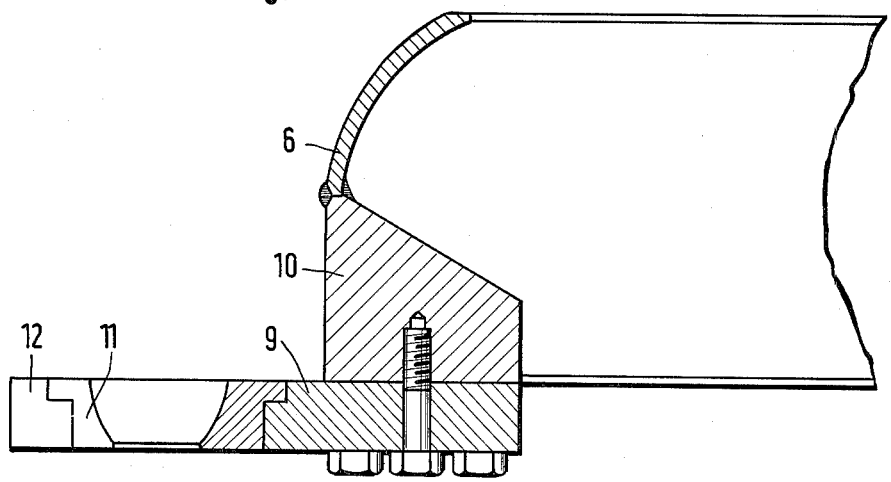
FIG. 3 is a sectional view of an embodiment of the receptacle device of the frame.
Figure 4:
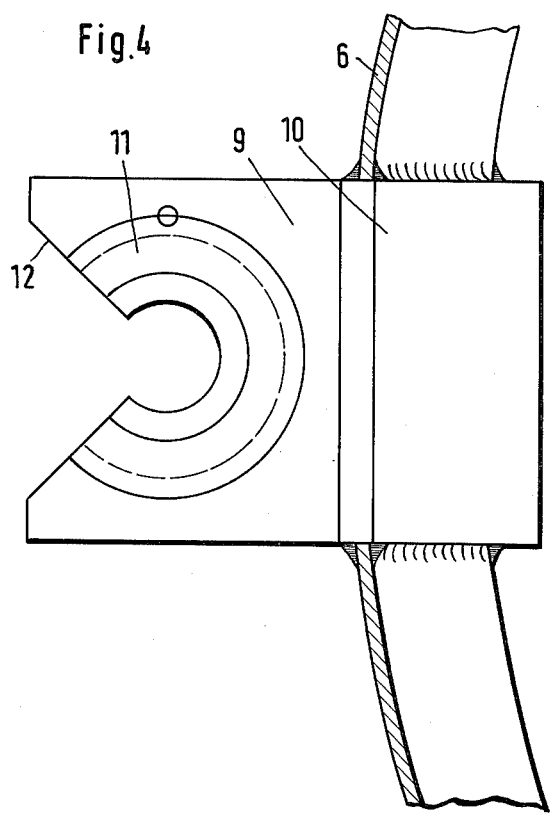
FIG. 4 is a plan view of the receptacle device of FIG. 3.

A frame 4, of which the suspension device 5 for the hanging of the articles is supported by the current ring 3, can be arranged in receptacle 1, symmetrically to its inside. The suspension device 5 possesses a ring 6, which is semicircular in section, with outwardly directed curvature. Carrier arms 7 are fastened to ring 6, being directed towards the outside and each having a contact strip 8 at the free end, resting on the current ring 3 when the frame 4 is in receptacle 1, and assuring an electrical connection between the current ring 3 and the frame 4. Outwardly directed receptacle devices 9 are arranged on ring 6, between the carrier arms 7, configured as brackets and, for example, each bolted to an intermediate component 10 (see FIG. 3) which is connected with ring 6. The weight of this type of construction is relatively low. Each bracket 9 is formed with a ball socket 11 with an insertion opening 12. In the illustrated embodiment, the ball socket 11 is configured as a replaceable component. However, it can also be integral with the bracket 9 itself.

In each ball socket 11, an article carrier 13 can be hung, having a spherical plug 14, of which the ball diameter corresponds to that of the ball socket 11, in order to thus form a spherical cardan suspension for the article carrier 13. The spherical plug 14 is connected with a transport plug 15 on the one hand and, through a bolt 16 which is directed downward in the suspended condition of the article carrier 13, with a star 17, which has three arms, and on the ends of each of which an article 18, such as a crankshaft, can be fastened.

With the hung article carrier 13, the transport plug 15 is directed upward and extends beyond bracket 9, so that it can be engaged by a gripper for the removal of the articles from the frame, the article carrier with the articles can be lifted and can be removed from bracket 9 through the insertion opening 12. The charging of the article carrier with the article is carried out correspondingly. The spherical cardan suspension guarantees a bending stress-free suspension of the articles and a large contact surface between spherical plug 14 and ball socket 11, so that a good electrical contact from the current ring 3, through the arms 7, the ring 6, the brackets 9 and the article carrier 13 to the articles 18 is assured, when the total frame 4 serves as current conductor. Frame 4, with articles 18, can be loaded with workpieces outside the receptacle 1 and be inserted as an entity in receptacle 1. The seating surfaces of the spherical cardan suspension are protected from a possible spraying during the glow discharge treatment and, therefore, remain dimensionally stable.

As a function of the length of the workpiece articles 18 and of the receptacle 1, it can be appropriate to configure the frame in several levels, by arranging a second ring 6', as in the illustrated embodiment, at an appropriate distance below the first ring 6, wherein ring 6' is connected to ring 6 by means of tie rods 19. As in the case of ring 6, ring 6' is provided with brackets 9 for the acceptance of article carriers 13.

Figure 5:
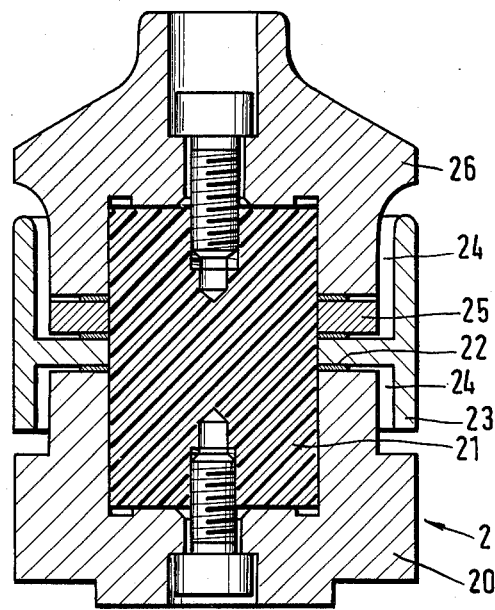
FIG. 5 shows an insulator in a receptacle for the acceptance of the frame.

Insulators 2 can consist of an anode plate 20 (FIG. 5), into which a ceramic insulating component 21 is inserted and is fastened by means of a screw. The ceramic component 21 extends beyond the anode plate 20 and is surrounded by a mica ring 22 with a smaller diameter than the anode plate 20, whereby the mica ring 22 is supported on the anode plate 20. A T-shaped section neutral cap 23, which is separated from the anode plate by a gap 24 because of the mica ring 22. A further mica ring is positioned above the neutral cap 23, followed by a neutral ring 25 and a further mica ring 22. A cathode plate 26 is set on the ceramic component 21, and is screwed to the ceramic component 21. Gaps 24 are also located between the neutral ring 25, the T-shaped neutral cap 23, and the cathode plate 26, whereby the system of gaps assures that an electrical bridge cannot be created between the anode plate 20 and the cathode plate 26 due to a possible vapor coating of a metal film.

Insulators 2 can be fastened on brackets which are connected with the wall of receptacle 1. In order to compensate for the heat expansion of frame 4, without displacing contact strips 8 on the current ring 3, insulators 2 can additionally be supported on rollers and be arranged radially movable around the magnitude of heat expansion which can be expected.

Figure 6:
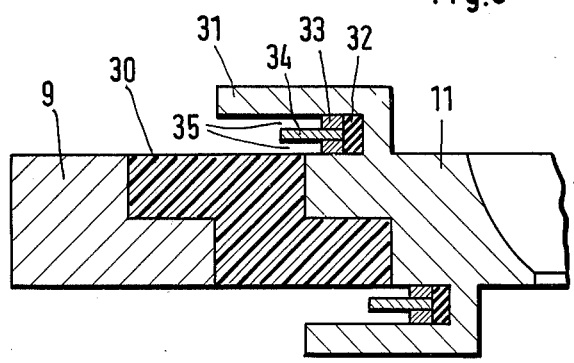
FIG. 6 is a fragmentary sectional view of an additional embodiment of a receptacle device.

In order to save electrical energy during the glow discharge treatment and not to treat the frame itself, the article carriers 13 can be electrically insulated with respect to the receptacle devices 9. For this purpose, in accordance with FIG. 6, bracket 9 can include a ceramic ring 30, which supports the ball socket 11. On the ball socket 11 and/or on bracket 9, a system of gaps can thus also be provided, corresponding to that of insulator 2, in order to prevent electrical contact between bracket 9 and ball socket 11, and thus the article, by a possible formation of a metal film. For this purpose, the ball socket 11 can be provided at the top and bottom with an angular-section ring 31, which covers the ceramic ring at least partially, and which is surrounded on its inside by an insulating ring 32, whereby one or several neutral rings 34 are supported on the insulating ring 32, which are separated from the ball socket 11 and ring 31, and from each other, by mica rings 33, with the formation of gaps 35.

However, the system of gaps for the prevention of the formation of an electrical bridge between the article carrier 13 and bracket 9 can also be provided on article carrier 13, in that the appropriage insulating components, neutral rings, and mica rings are arranged on bolt 16, respectively above the ball socket 11 at the lower portion of the transport plug 15.

When the article carriers 13 are electrically insulated with respect to brackets 9, the article carriers 13 must be individually connected with a conductor which passes through the wall of the receptacle with insulation.

For this purpose, drop arms, which are not illustrated, can be provided on the wall of receptacle 1, enveloping the transport plug 15 and capable of being brought into engagement with them, with electrical connection, if, for example, the transport plug possesses a sphere at its end, while the drop arms evidence corresponding semi-spherical recesses at their ends, which envelope the spheres of the transport plugs 15. The drop arms must then be electrically insulated with respect to receptacle 1 and can be arranged, for example, on a current ring.

In the case of article carriers 13, which are insulated with respect to frame 4, the remaining portion of frame 4 can be insulated and thus be kept at a floating potential, but it is preferred to conductingly connect the remaining portion of frame 4 with receptacle 1.

It may be appropriate to use brackets to support the carrying arms 7, instead of the ring 3.

Figure 2:
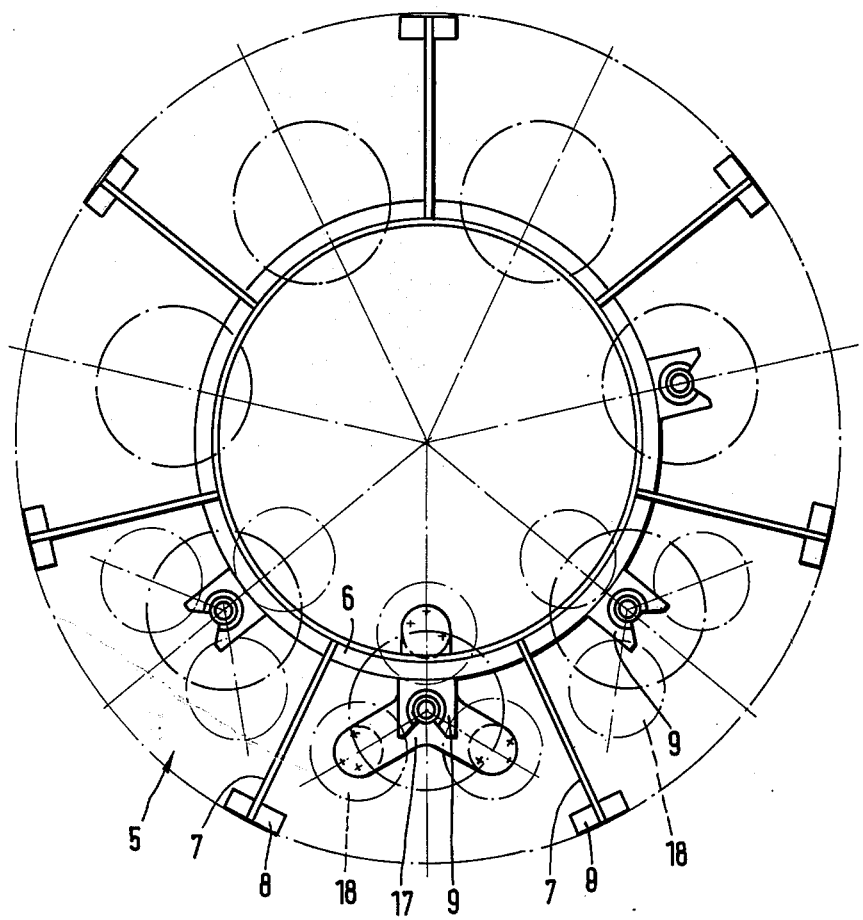
FIG. 2 shows the frame of FIG. 1 in plan view.

In the arrangement of the articles in frame 4, illustrated in FIG. 2, it is appropriate to use a water-cooled inner anode if receptacle 1 is water-cooled, so that the heat dissipation of the articles 18, and thus the temperature of all articles, even those which are arranged further towards the inside of the container, is practically uniform, in order to obtain reproducible results, for example, during nitride hardening.

Articles 18 which are held at the ends of stars 17, can be connected to stars 17 through fastening devices which are adapted to the corresponding articles, for example, by screws.

The workpieces are suspended in the receptacle by means of the carrying frame, but not rotated in any manner. The frame is rotated only during the charging of the workpieces outside the receptacle, in order to facilitate the positioning of the workpieces in the carrying frame. With respect to the carrying frame first described, it is essential to establish good electrical contact between the frame and the workpieces after the hanging of the pieces, because, for example, if only point contact exists, the danger of welding between the frame and the pieces may arise. Because the workpieces are heated to temperatures of 550° and more during the treatment, the frame must carry the workpieces without bending stresses, in order to avoid distortion. In contrast, only a single workpiece or possibly a carrying frame may be suspended on the suspension device of U.S. Pat. No. 3,865,451. The object attained by the present invention therefore cannot be achieved by the known carrying frame; it has been attained by the frame of the present invention.

We claim:

1. Supporting means for articles to be treated in a glow discharge receptacle connected to a source of electrical power, comprising:
   a support frame in said receptacle and having upwardly open spherical seats, each having a laterally open entrance slot;
   article suspension devices each having means for attaching an article thereto, neck portions in said entrance slots, spherical plugs on said neck portions and removably seated in said spherical seats, and transport plugs extending above said spherical plugs;
   said suspension devices being electrically insulated from said receptacle; and
   conductor means for connecting said suspension devices to said source of electrical power whereby a glow discharge is produced between said receptacle and said article on said suspension device.

2. Supporting means as defined in claim 1 wherein said support frame and suspension devices are electrically conductive.

3. Supporting means as defined in claim 1 wherein said suspension devices are electrically insulated from said support frame and are provided with means for connection to an electrical conductor.

4. Supporting means as defined in claim 1 wherein said support frame is provided with aid spherical seats at a plurality of superposed levels.

5. Supporting means as defined in claim 1 wherein said suspension devices have outwardly extending arms, said means for attaching articles thereto being provided at the outer ends of each of said arms.

6. Supporting means as defined in claim 1 wherein means defining said spherical seats are removably mounted on said support frame.

7. Supporting means as defined in claim 1 wherein said support frame comprises a ring to which said spherical seats are attached, and carrier arms extending outwardly from said rings for supporting engagement with a receptacle.

8. Supporting means as defined in claim 7 wherein said ring is of semi-circular sectional shape with outwardly directed curvature.

9. Supporting means as defined in claim 1 including a receptacle having support means therein, electrically insulated from said receptacle, and releasably supporting said support frame; and an electrical conductor extending into said receptacle but insulated therefrom.

10. Supporting means as defined in claim 9 wherein said support means rest on electrical insulators carried by side walls of said receptacles and are movable relative to said side walls.

11. Supporting means as defined in claim 10 wherein said electrical conductor is connected to said support means.

12. Supporting means as defined in claim 10 and including movable arms in said container, electrically insulated therefrom, and movable into contact with said transport plugs, said conductor being connected to said arms.

13. Supporting means as defined in claim 12 wherein said arms are mounted on insulators which are movably supported relative to said side walls of said receptacle.

* * * * *